(12) United States Patent
Zhu et al.

(10) Patent No.: US 8,766,371 B2
(45) Date of Patent: Jul. 1, 2014

(54) SEMICONDUCTOR STRUCTURE AND METHOD FOR MANUFACTURING THE SAME

(75) Inventors: Huilong Zhu, Poughkeepsie, NY (US);
Qingqing Liang, Beijing (CN);
Zhijiong Luo, Poughkeepsie, NY (US);
Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 70 days.

(21) Appl. No.: 13/256,866

(22) PCT Filed: Feb. 25, 2011

(86) PCT No.: PCT/CN2011/071318
§ 371 (c)(1),
(2), (4) Date: Sep. 15, 2011

(87) PCT Pub. No.: WO2011/160463
PCT Pub. Date: Dec. 29, 2011

(65) Prior Publication Data
US 2012/0104508 A1    May 3, 2012

(30) Foreign Application Priority Data
Jun. 22, 2010  (CN) .......................... 2010 1 0215163

(51) Int. Cl.
*H01L 21/70* (2006.01)
(52) U.S. Cl.
USPC .................... 257/369; 257/E21.633; 438/199
(58) Field of Classification Search
CPC ................................. H01L 29/7845
USPC ........................................ 257/369
See application file for complete search history.

(56) References Cited

U.S. PATENT DOCUMENTS

2003/0040158 A1   2/2003  Saitoh
2006/0065939 A1*  3/2006  Doczy et al. ................. 257/412
(Continued)

FOREIGN PATENT DOCUMENTS

CN        1846313        10/2006
CN        101243556 A     8/2008

OTHER PUBLICATIONS

Yang et al., "Dual Stress Liner for High Performance sub-45nm Gate Length SOI CMOS Manufacturing," Electron Devices Meeting, 2004. IEDM Technical Digest. IEEE International , pp. 1075, 1077, Dec. 13-15, 2004; doi: 10.1109/IEDM.2004.1419385.*
International Search Report (Chinese) PCT/CN2011/071318.

(Continued)

*Primary Examiner* — Eva Yan Montalvo
*Assistant Examiner* — Christopher Johnson
(74) *Attorney, Agent, or Firm* — Troutman Sanders LLP

(57) ABSTRACT

There is provided a semiconductor structure and a method for manufacturing the same. The semiconductor structure according to the present invention comprises: a semiconductor substrate; a channel region formed on the semiconductor substrate; a gate stack formed on the channel region; and source/drain regions formed on both sides of the channel region and embedded in the semiconductor substrate. The gate stack comprises: a gate dielectric layer formed on the channel region; and a conductive layer positioned on the gate dielectric layer. For an nMOSFET, the conductive layer has a compressive stress to apply a tensile stress to the channel region; and for a pMOSFET, the conductive layer has a tensile stress to apply a compressive stress to the channel region.

20 Claims, 12 Drawing Sheets

(56) References Cited

U.S. PATENT DOCUMENTS

2006/0281272 A1* 12/2006 Yang et al. .................. 438/303
2007/0111421 A1* 5/2007 Cabral et al. ................. 438/199
2007/0141798 A1 6/2007 Bohr
2010/0203690 A1* 8/2010 Matsumoto ................. 438/199
2011/0260257 A1* 10/2011 Jagannathan et al. ........ 257/369

OTHER PUBLICATIONS

Written Opinion (Chinese) PCT/CN2011/071318.

* cited by examiner

SEMICONDUCTOR STRUCTURE AND METHOD FOR MANUFACTURING THE SAME

BENEFIT CLAIMS

This application is a National Phase application of, and claims priority to, PCT Application No. PCT/CN2011/071318, filed on Feb. 25, 2011, entitled "Semiconductor Structure and Method for Manufacturing the Same", which claimed priority to Chinese Application No. 201010215163.3, filed on Jun. 22, 2010. Both the PCT Application and Chinese Application are incorporated herein by reference in their entireties.

TECHNICAL FIELD

The present invention relates to the semiconductor field, and more particularly, to a semiconductor structure which can effectively provide the channel stress, and also a method for manufacturing the same.

BACKGROUND

With the development of the semiconductor technology, requirements for the feature size and performance of CMOS-FET (Complementary Metal Oxide Semiconductor Field Effect Transistor) devices are increasing continuously. The application of the strained channel technology to the MOSFETs can improve device performance. For example, it is possible to enhance the carrier mobility by applying stress to the channel between the source and drain, so as to improve the performance of Integrated Circuits. Specifically, for an nMOSFET, the carriers in the channel are electrons, and a tensile stress across the channel can improve the mobility of the electrons; while for a pMOSFET, the carriers in the channel are holes, and a compressive stress across the channel can improve the mobility of the holes.

However, due to the increased density and reduced pitch of the Integrated Circuits, it is more difficult for the strained channel to provide sufficient stress to satisfy the requirements for device performance.

In view of this, there is a need for a novel semiconductor structure and a method for manufacturing the same to further enhance the channel stress.

SUMMARY

An object of the present invention is to provide a semiconductor structure and a method for manufacturing the same, to overcome the above described problems in the prior art, and especially to further improve the channel stress for MOSFETs.

According to an aspect of the invention, there is provided a semiconductor structure, comprising: a semiconductor substrate; a channel region formed on the semiconductor substrate; a gate stack formed on the channel region; and source/drain regions respectively formed on both sides of the channel region and embedded in the semiconductor substrate, wherein the gate stack comprises: a gate dielectric layer formed on the channel region; and a conductive layer positioned on the gate dielectric layer, and wherein for an nMOSFET, the conductive layer has a compressive stress to apply a tensile stress to the channel region; and for a pMOSFET, the conductive layer has a tensile stress to apply a compressive stress to the channel region.

Preferably, the gate dielectric layer extends to form sidewalls of the gate stack.

Preferably, according to an embodiment of the invention, the conductive layer comprises a work function metal layer which is positioned on the gate dielectric layer and extends to form a portion of sidewalls of the gate stack, and a stressed layer which has a tensile stress or a compressive stress and is formed on the work function metal layer.

Alternatively, the gate dielectric layer is positioned on the channel region and extends to form sidewalls of the gate stack, and the work function metal layer is positioned on the gate dielectric layer.

Preferably, the conductive layer comprises a compound of TiAl.

Alternatively, the semiconductor structure has a stressed layer covered thereon. Specifically, the nMOSFET has a tensile-stressed layer covered thereon, and the pMOSFET has a compressive-stressed layer covered thereon. Preferably, the stressed layer has an opening formed therein above the gate stack, to enhance the tensile stress across the channel region for the nMOSFET or the compressive stress across the channel region for the pMOSFET.

According to a further aspect of the invention, there is provided a method for manufacturing a semiconductor structure, comprising: providing a semiconductor substrate; forming a sacrificial gate on the semiconductor substrate and a spacer surrounding the sacrificial gate; forming source/drain regions respectively on both sides of the spacer, so as to a channel region beneath the sacrificial gate; removing the sacrificial gate to form an opening within the spacer; and forming a gate stack comprising a conductive layer in the opening, wherein, for an nMOSFET, the conductive layer has a compressive stress to apply a tensile stress to the channel region; and for a pMOSFET, the conductive layer has a tensile stress to apply a compressive stress to the channel region.

Preferably, the step of forming the gate stack in the opening comprises: forming a gate dielectric layer in the opening; and forming the conductive layer on the gate dielectric layer. Alternatively, the gate dielectric layer may be formed to cover bottom and sidewalls of the opening so that the gate dielectric layer extends to form sidewalls of the gate stack.

Preferably, the step of forming the conductive layer may comprise: forming a work function metal layer to cover bottom and sidewalls of the opening; and forming a stressed layer on the work function metal layer.

Preferably, for the nMOSFET, the step of forming the stressed layer comprises sputtering TiAl to form a tensile-stressed layer; and for the pMOSFET, the step of forming the conductive layer comprises alternately forming Ti thin films and Al thin films and annealing to form a compressive-stressed layer made of TiAl.

Alternatively, after the conductive layer is formed, the method further comprises: forming a stressed layer on the semiconductor structure, and specifically, forming a tensile-stressed layer on the nMOSFET or forming a compressive-stressed layer on the pMOSFET.

Preferably, after forming the tensile-stressed layer or the compressive-stressed layer, the method further comprises: forming an opening in the tensile-stressed layer or the compressive-stressed layer above the gate stack, to enhance the tensile stress or the compressive stress across the channel region.

According to the semiconductor structure and the method for manufacturing the same according to embodiments of the invention, the conductive layer of the gate stack can have the stress, and specifically, has the compressive stress for the nMOSFET to apply the tensile stress across the cannel for the nMOSFET, and has the tensile stress for the pMOSFET to apply the compressive stress across the channel for the pMOSFET. According to further embodiments of the invention, the further stressed layers are formed respectively on the nMOSFET structure and the pMOSFET structure, and have the openings therein above the respective gate stacks, so as to greatly increase the stress in the channel regions.

BRIEF DESCRIPTION OF DRAWINGS

The above and other objects, features and advantages of the present invention will be more apparent from the following descriptions on embodiments of the present invention with reference to the drawings, wherein.

DETAILED DESCRIPTION OF EMBODIMENTS

Figure 1:
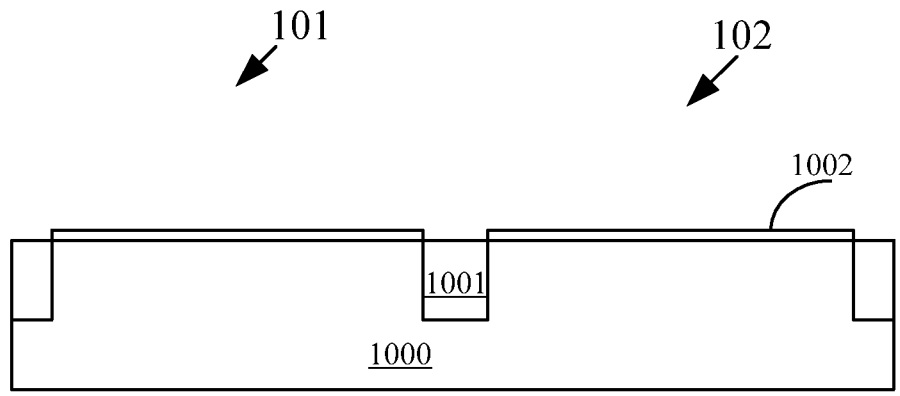
FIGS. 1-23 are section views schematically showing structures obtained in respective steps of a flow for manufacturing a semiconductor structure according to an embodiment of the present invention.

Hereinafter, the present invention is described with reference to embodiments shown in the attached drawings. However, it is to be understood that those descriptions are just provided for illustrative purpose, rather than limiting the present invention. Further, in the following, descriptions of known structures and techniques are omitted so as not to unnecessarily obscure the concept of the present invention.

In the drawings, various layer structures according to embodiments of the present invention are schematically shown. However, they are not drawn to scale, and some features may be enlarged while some features may be omitted for clarity. Shapes, sizes and relative locations of respective regions and layers shown in the drawings are just illustrative, and deviations therefrom may occur due to manufacture tolerances and technical limits. Those skilled in the art can also devise regions/layers of different shapes, sizes and relative locations as desired.

FIGS. 1-23 are section views schematically showing structures obtained in respective steps of a flow for manufacturing a semiconductor structure according to an embodiment of the present invention. Hereinafter, the respective steps according to the embodiment and the resulting semiconductor structure will be described in detail with reference to those drawings.

In the embodiment of the present invention, a semiconductor structure composed of an nMOSFET and a pMOSFEt is exemplified. However, for the present invention, it is possible to form only an nMOSFET or only a pMOSFET, which also falls into the scope of the present invention.

First, as shown in FIG. 1, a semiconductor substrate 1000 is provided, on which an nMOSFET region 101 and a pMOSFET region 102 and also an isolation region are formed. Preferably, oxide layers 1002 may be formed respectively on the nMOSFET region 101 and the pMOSFET region 102, for example, $SiO_2$ layers formed by thermal oxidation or deposition.

Figure 2:
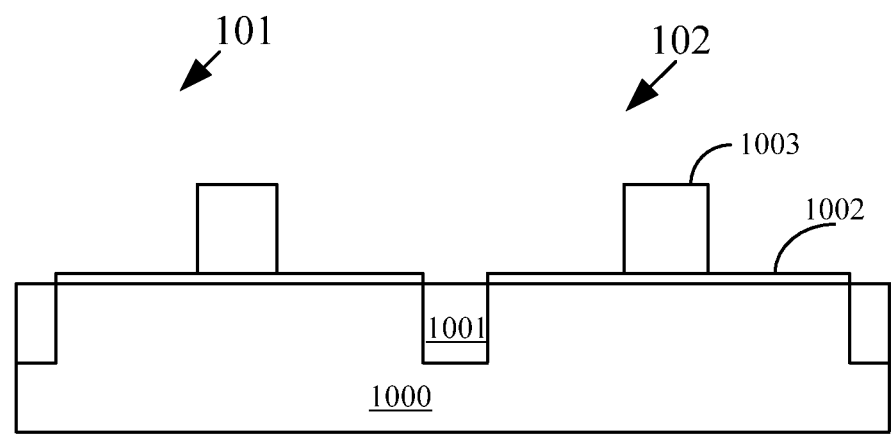

Next, as shown in FIG. 2, sacrificial gates 1003 are formed respectively on the oxide layers 1002. The sacrificial gates 1003 may be formed by depositing a layer of polysilicon on the whole semiconductor structure, applying a photoresist layer on the polysilicon layer, patterning the photoresist based on the shapes of the sacrificial gates to be formed, and then etching the polysilicon based on the patterned photoresist to obtain the sacrificial gate configuration shown in FIG. 2.

Figure 3:
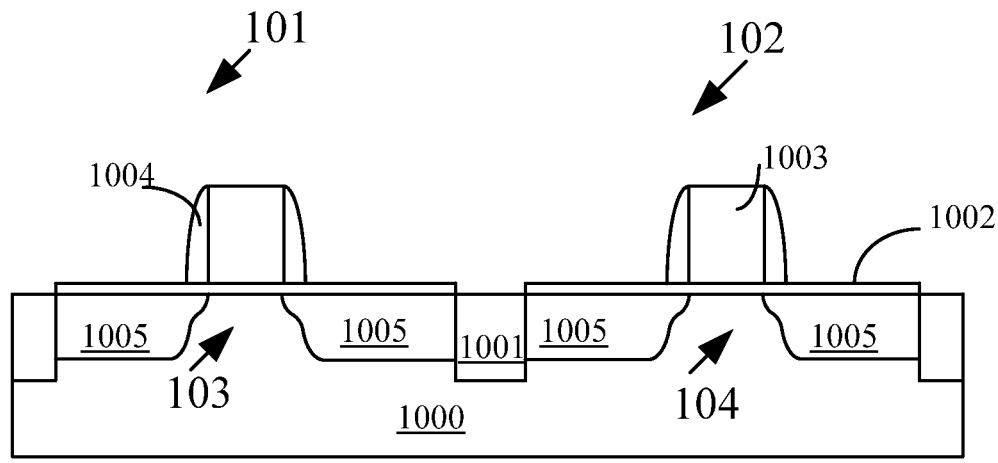

Then, as shown in FIG. 3, spacers 1004 are formed on sidewalls of respective sacrificial gates 1003, and source/drain regions 1005 are formed on both sides of the respective spacers by conventional methods for forming source/drain regions and spacers. Specifically, this may be done as follows, for example. The regions on both sides of the respective sacrificial gates 1003 are lightly doped to form source/drain extension regions, or Halo regions may be formed by means of Halo implantation, which are optional processes. Then, the spacers 1004 are formed on sidewalls of the respective sacrificial gates 1003, for example, by forming a layer of $Si_3N_4$ or some other insulation materials on the whole semiconductor structure and then performing Reactive Ion Etching (RIE) to the $Si_3N_4$ to form the spacers 1004 as shown in FIG. 3. Finally, heavy doping is conducted to form the source/drain regions 1005 as shown in FIG. 3. By then, dopants in the source/drain regions may be activated by spike annealing or laser annealing at about 1000-1100° C. As a result of the formation of the source/drain regions, channel regions 103 and 104 are formed between the source/drain regions.

Portions of the oxide layers 1002 outside the spacers are removed.

Figure 4:
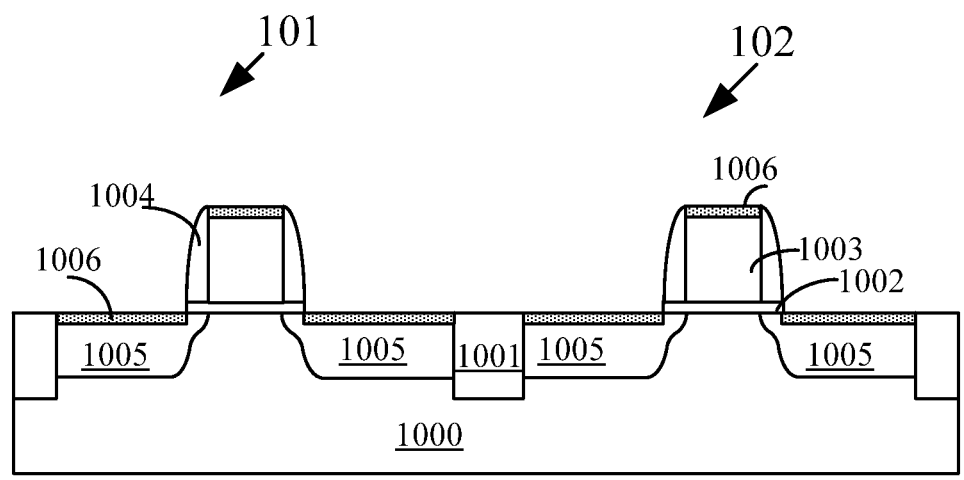

Optionally, as shown in FIG. 4, metal silicides 1006 are formed on the source/drain regions 1005 and the sacrificial gates 1003, respectively. Specifically, a layer of metal materials such as Ni, Co, Ti, and NiPt may be deposited on the whole semiconductor structure, and then is subjected to annealing to form the metal silicides. According to an embodiment of the invention, a layer of NiPt may be deposited to have a thickness of about 3-12 nm, and then is subjected to fast annealing at about 300-500° C. to form SiPtNi, and the unreacted NiPt is removed by means of wet etching.

Figure 5:
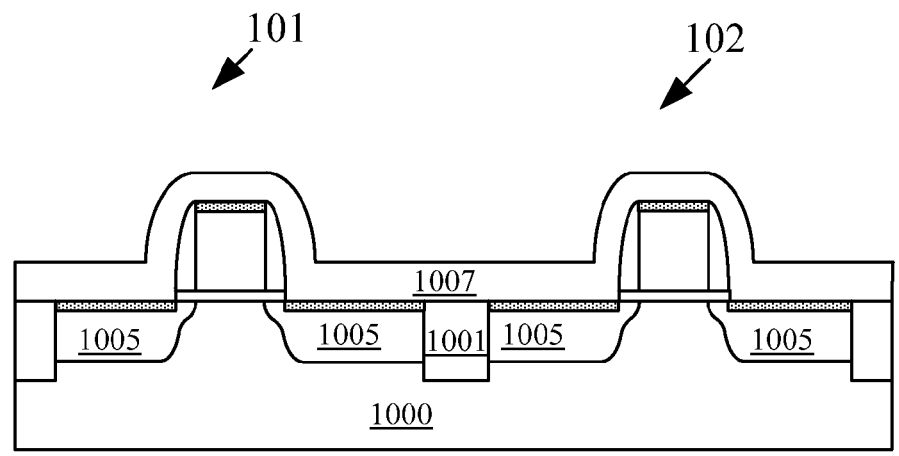
Figure 6:
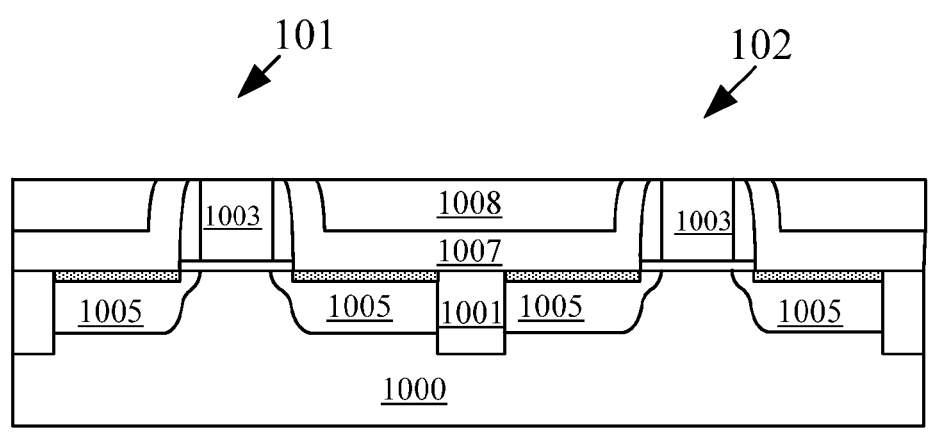

Next, as shown in FIG. 5, a nitride layer 1007 such as $Si_3N_4$ or the like is deposited on the whole semiconductor structure. As shown in FIG. 6, an oxide layer 1008 is further deposited on the nitride layer 1007. The oxide layer 1008 and the nitride layer 1007 are subjected to a Chemical Mechanical Polishing (CMP) process to expose the sacrificial gates 1003, and a structure shown in FIG. 6 is provided.

Figure 7:
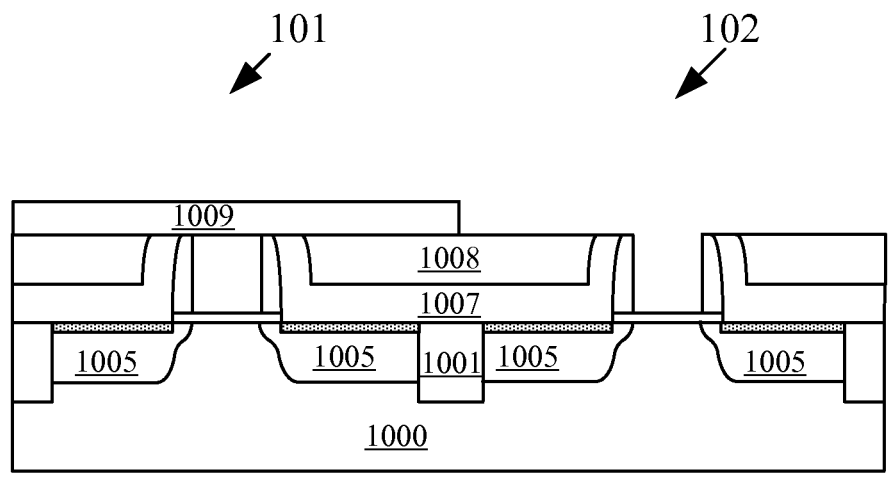

Then, as shown in FIG. 7, an oxide layer 1009 such as $SiO_2$ with a thickness of about 5-20 nm is formed on the nMOSFET region 101 on the left side. This may be done by forming an oxide layer on the whole semiconductor structure and then patterning it to form the oxide 1009 as shown in FIG. 7. Subsequently, the sacrificial gate 1003 on the pMOSFET region 102 is removed to form an opening, for example, by means of dry or wet etching.

Figure 8:
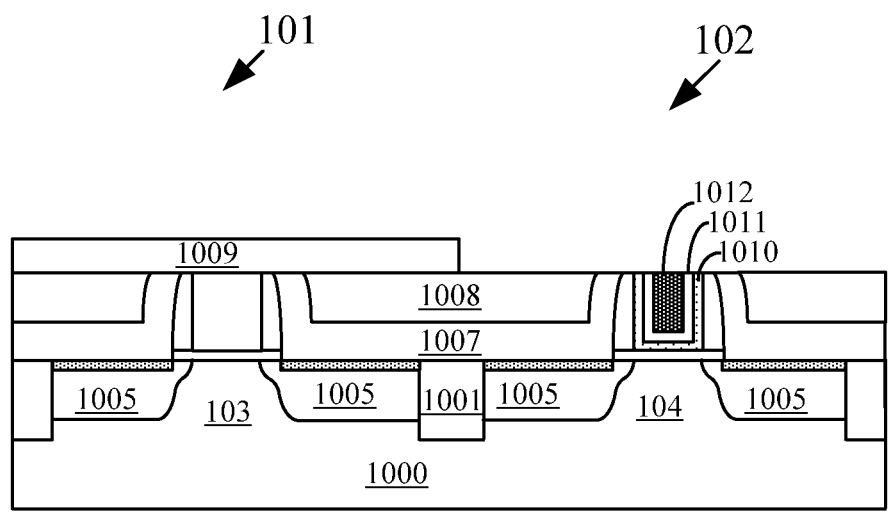

Next, as shown in FIG. 8, a gate dielectric layer 1010, a work function metal layer 1011 and a stressed layer 1012 is formed sequentially to cover the bottom and side walls of the opening, wherein the work function metal layer 1011 and the stressed layer 1012 together are referred to as a conductive layer. In a case where the oxide layer 1002 is not formed, the gate dielectric layer 1010 may be directly formed on the channel region 104. Further, the gate dielectric layer 1010 may cover only the bottom of the opening. The gate dielectric layer 1010 preferably comprises a high-k gate dielectric material such as $HfO_2$, HfSiO, HfSiON, HfTaO, HfTiO, HfZrO, $Al_2O_3$, $La_2O_3$, $ZrO_2$, LaAlO and the like, with a thickness of about 1-5 nm. The work function metal layer 1011 is p-type, and has a work function which differs from the valence band of Si by a value smaller than 0.2 eV, comprising any one of $MoN_x$, TiSiN, TiCN, TaAlC, TiAlN, TaN, $PtSi_x$, $Ni_3Si$, Pt, Ru, Ir, Mo, HfRu and $RuO_x$, or any combination thereof. The stressed layer 1012 may be formed as follows. Ti thin films and Al thin films are formed alternately, for example, by depositing one Ti thin film and then one Al thin film, and depositing one further Ti thin film and then one further Al thin film, and so on, until the gap formed by the p-type work function metal layer 1011 in the gate is filled up. Next, an annealing process is performed at about 300-500° C. to form a tensile-stressed TiAl thin film. Then, the TiAl layer 1012 and the p-type work function metal layer 1011 are etched back to form the structure shown in FIG. 8. And then, the oxide layer 1009 is removed.

Figure 9:
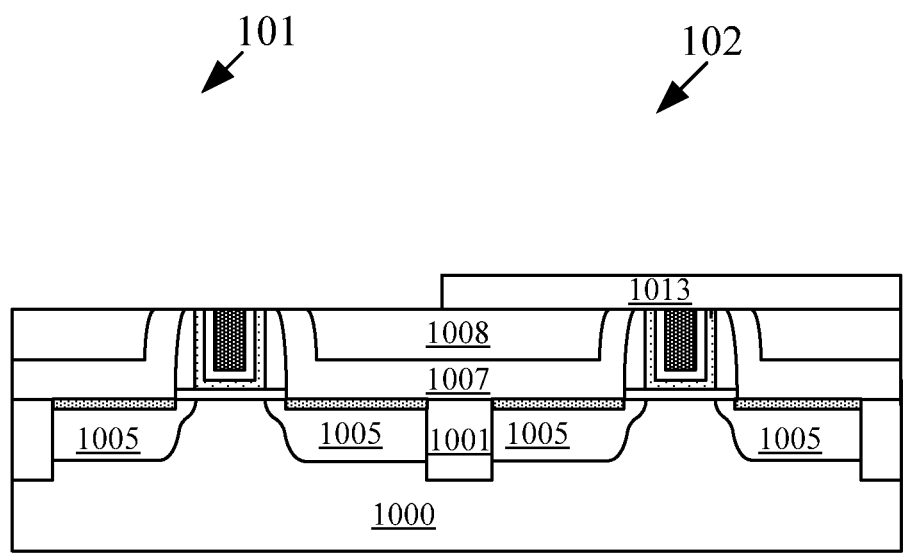

Likewise, a gate stack on the nMOSFET region 101 on the left side may be formed in the same way as the gate stack on the pMOSFET region. As shown in FIG. 9, first, an oxide layer 1013 is provided to cover the pMOSFET region 102. Next, the sacrificial gate 1003 on the nMOSFET region is etched away to form an opening. Then, a gate dielectric layer 1010, an n-type work function metal layer 1011 and a stressed layer 1012 are formed sequentially to cover the bottom and side walls of the opening, wherein the n-type work function metal layer 1011 and the stressed layer 1012 together are referred to as a conductive layer. The n-type work function metal layer 1011 may have a work function which differs from the conduction band of Si by a value smaller than 0.2 eV, comprising any one of TaC, TiN, TaTbN, TaErN, TaYbN, TaSiN, HfSiN, MoSiN, RuTa$_x$ and NiTa$_x$, or any combination thereof. The stressed layer 1012 may be formed as follows. A compound of TiAl is sputtered on the n-type work function metal layer 1011 to fill in the gap formed by the n-type work function metal layer 1011, so as to form a tensile-stressed TiAl thin film. Then, the TiAl film and the n-type work function metal layer are etched back to form the structure shown in FIG. 9. And then, the oxide layer 1013 is removed.

Figure 10:
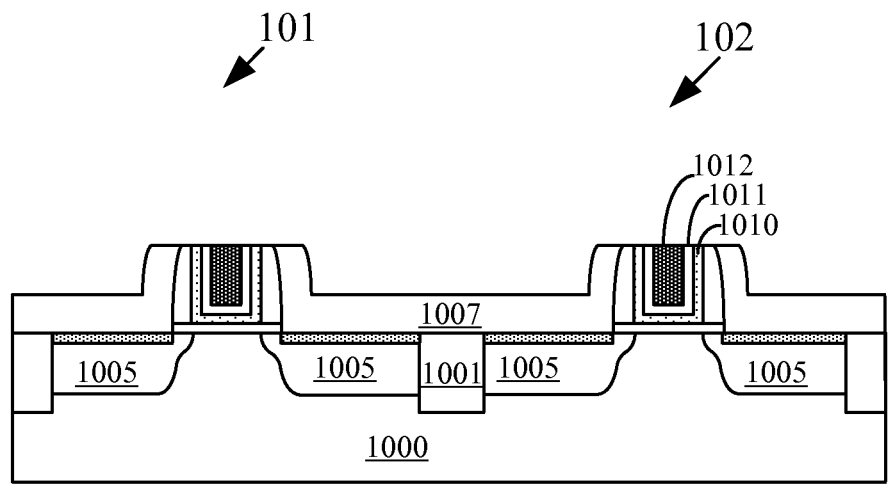

Next, as shown in FIG. 10, the oxide layer 1008 is removed by Reactive Ion Etching (RIE).

Figure 11:
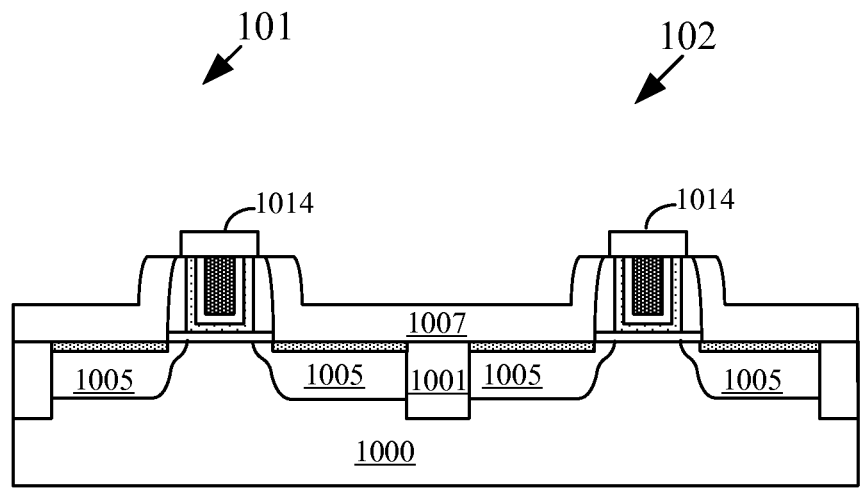

As shown in FIG. 11, oxide cap layers 1014 are formed on the gate stacks for the pMOSFET and nMOSFET, respectively. Specifically, an oxide layer is deposited on the whole semiconductor structure, and the patterned photoresist are formed on top of the gate stacks for the pMOSFET and nMOSFET, respectively. Then, the oxide layer is etched with the patterned photoresist as a mask, and the photoresist is removed to form the structure as shown in FIG. 11.

Subsequently, the nitride layer 1007 and the spacers 1004 are selectively etched while keeping the oxide layers 1014 and the metal silicide 1006 to form the structure shown in FIG. 12. For the nMOSFET, with both the reaction force due to the removing of the nitride layer 1007 and the spacer 1004 and the compressive stress released from TiAl within the gate stack, a large tensile stress is produced across the channel 103. For the pMOSFET, with both the reaction force due to the removing of the nitride layer 1007 and the spacer 1004 and the tensile stress released from TiAl within the gate stack, a large compressive stress is produced across the channel 104.

Figure 12:
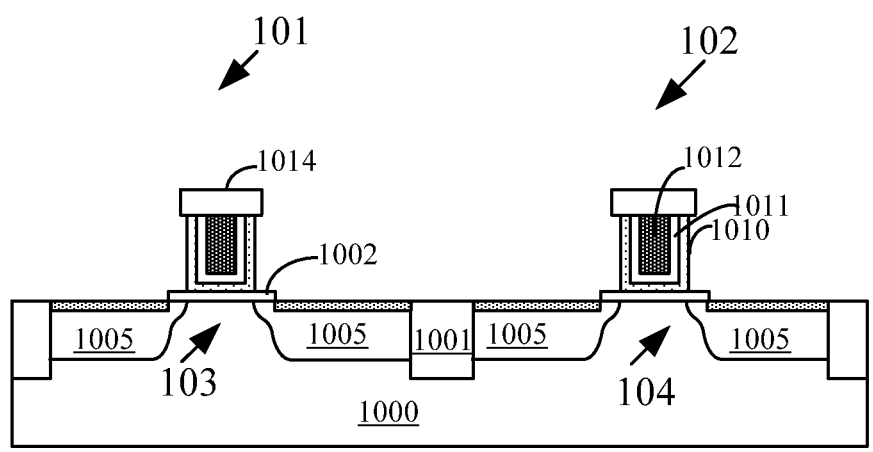

Thus, a semiconductor structure according to an embodiment of the present invention is achieved, which, as shown in FIG. 12, comprises: the semiconductor substrate 1000; the channel regions 103 and 104 formed on the semiconductor substrate 1000; the gate stacks formed on the channel regions 103 and 104, respectively; the source/drain regions 1005 respectively formed on both sides of the respective channel regions 103 and 104 and embedded in the semiconductor substrate.

Preferably, each of the gate stacks comprises the gate dielectric layer 1010 and the conductive layer which includes the work function metal layer 1011 and the stressed layer 1012. The gate dielectric layers 1010 are respectively formed on the channel region 103 and the channel region 104, and are extended to form the sidewalls of the respective gate stacks. The work function metal layers 1011 are formed on the respective gate dielectric layers 1010, and extend to the sidewalls of the respective gate dielectric layers 1010. The stressed layers 1012 are formed on the respective gate dielectric layers 1010 and fill the respective gaps formed by the respective work function metal layers 1011.

Here, for the nMOSFET, the work function metal layer 1011 is n-type and has a work function which differs from the conduction band of Si by a value smaller than 0.2 eV, and may comprise any one of TaC, TiN, TaTbN, TaErN, TaYbN, TaSiN, HfSiN, MoSiN, RuTa$_x$ and NiTa$_x$, or any combination thereof; and the stressed layer 1012 has a compressive stress to provide a tensile stress to the channel region 103. For the pMOSFET, the work function metal layer has a work function which differs from the valence band of Si by a value smaller than 0.2 eV, and may comprise any one of MoN$_x$, TiSiN, TiCN, TaAlC, TiAlN, TaN, PtSi$_x$, Ni$_3$Si, Pt, Ru, Ir, Mo, HfRu and RuO$_x$, or any combination thereof; the stressed layer 102 has a tensile stress to provide a compressive stress to the channel region 104.

There may be the further oxide layer 1002 such as SiO$_2$ between the gate stack and the channel region.

In the following, steps for further improving the tensile stress in the channel for the nMOSFET and the compressive stress in the channel for the pMOSFET will be described.

Figure 13:
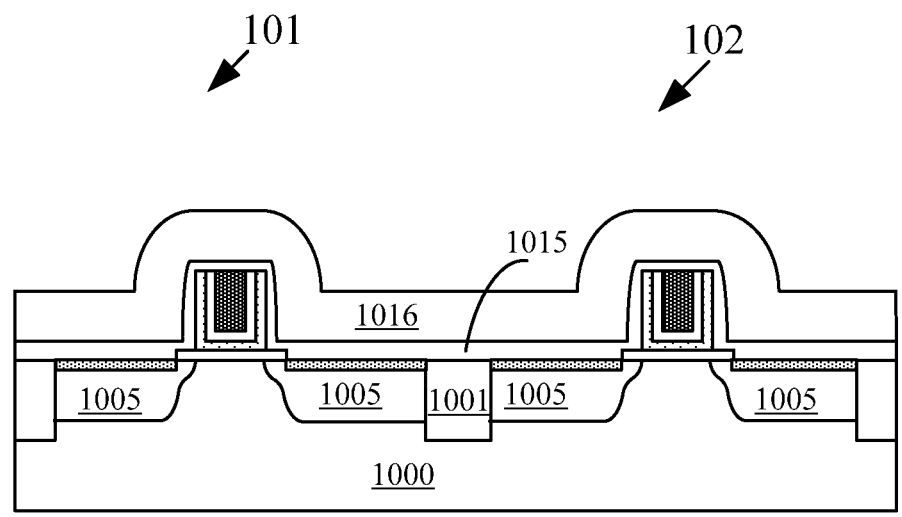

As shown in FIG. 13, an oxide layer 1015 such as SiO$_2$ with a thickness of about 3-5 nm is deposited on the whole semiconductor structure. And a tensile-stressed nitride layer 1016 such as Si$_3$N$_4$ with a thickness of about 30-100 nm is further deposited on the oxide layer 1015. The stress can be manipulated by controlling process parameters during the deposition process.

Figure 14:
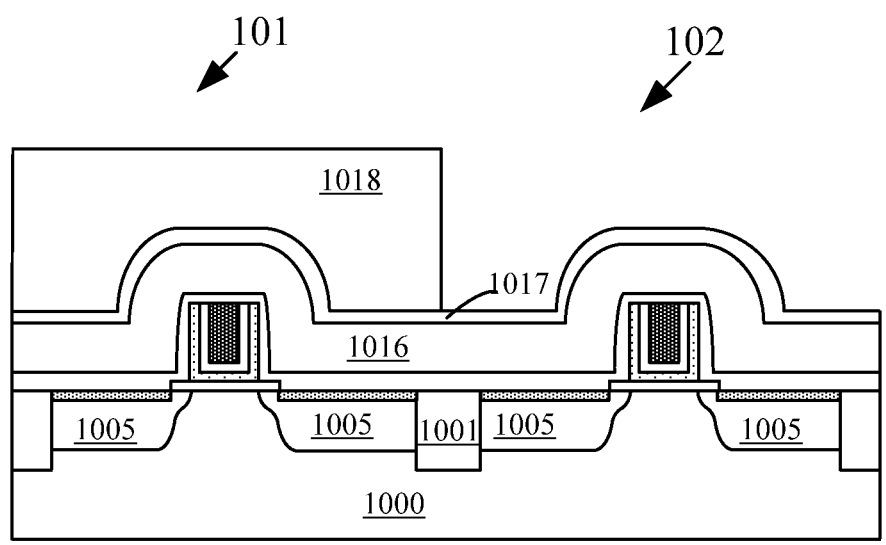

Next, as shown in FIG. 14, an etching stop layer 1017 such as an oxide layer is deposited on the nitride layer 1016. And then, a layer of photoresist 1018 is applied on a portion of the etching stop layer 1017 in the nMOSFET region 101.

Figure 15:
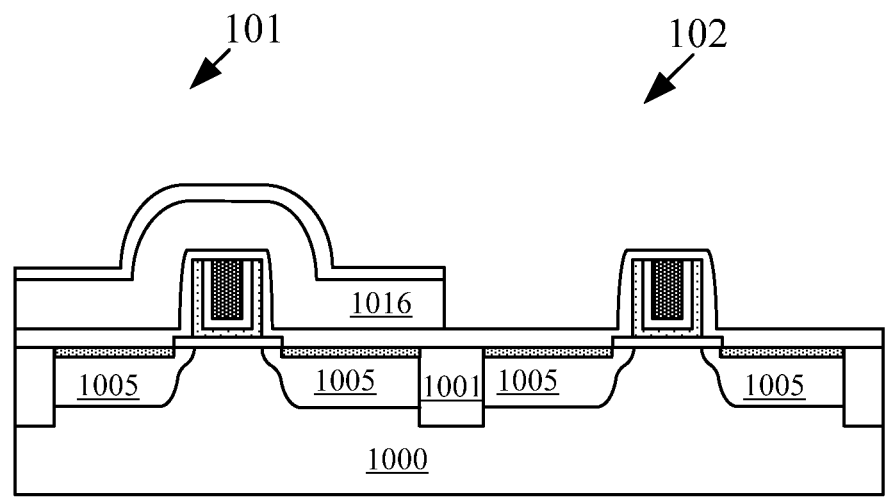

As shown in FIG. 15, the etching stop layer 1017 and the nitride layer 1016 are subjected to RIE sequentially. In RIE the nitride layer 1016, the nitride is selectively etched while the oxide 1015 is not etched. As a result, a tensile-stressed layer is formed in the nMOSFET region 101, to further improve the tensile stress across the channel region 103.

Figure 16:
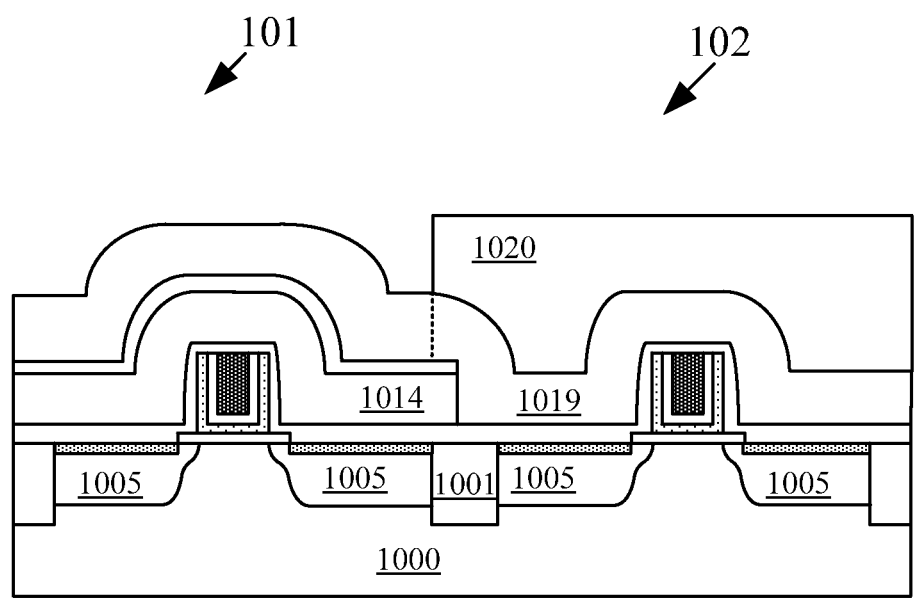

As shown in FIG. 16, a compressive-stressed nitride layer 1019 is deposited on the whole semiconductor structure, and a layer of photoresist 1020 is applied in the to pMOSFET region 102. Preferably, the photoresist 1020 partially overlaps the tensile-stressed nitride layer 1016 in the nMOSFET region 101, to ensure that the resulting tensile-stressed layer and the compressive-stressed layer may interact with each other at the interface therebetween.

The nitride layer 1019 is selectively etched using the photoresist 1020 as a mask. The etching stops on the oxide layer 1017, resulting in the structure shown in FIG. 17.

Figure 17:
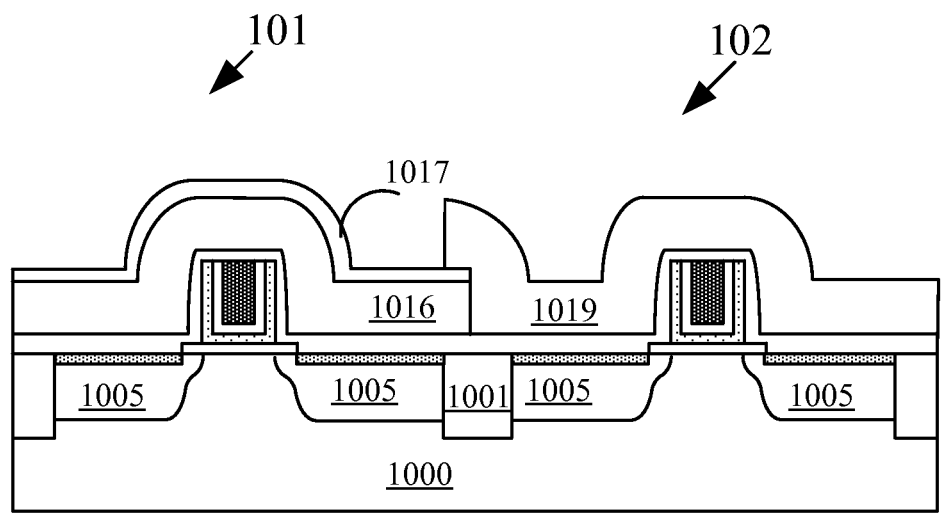

Thus, a semiconductor structure according to a further embodiment of the present invention is achieved, which, as shown in FIG. 17, comprises the tensile-stressed layer 1016 covering the nMOSFET region 101 and also having the oxide layer 1017 formed on the tensile-stressed layer 1016, and the compressive-stressed layer 1019 covering the pMOSFET region 102. Preferably, the compressive-stressed layer 1019 partially overlaps the tensile stressed layer, to ensure a larger interaction force between the tensile-stressed layer and the compressive-stressed layer.

Figure 18:
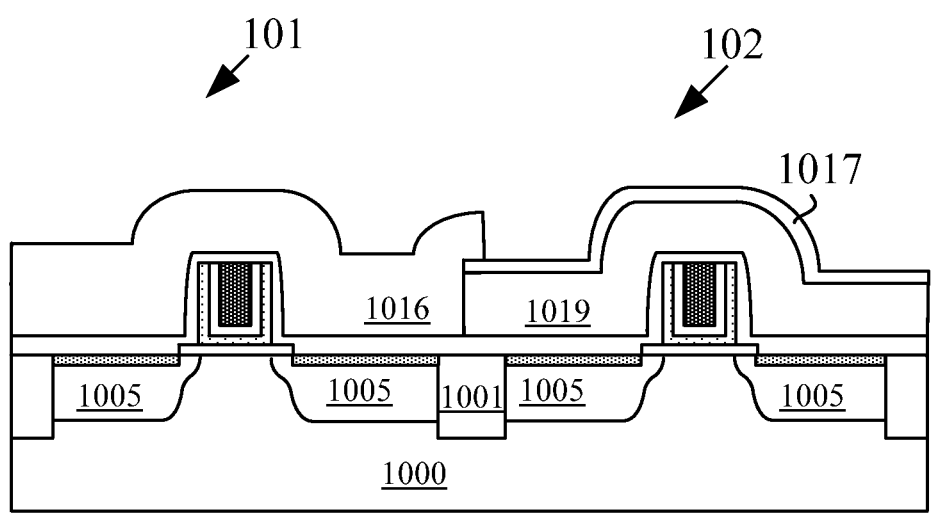

According to embodiments of the present invention, the semiconductor structure may be formed by different methods. For example, after the gate stacks and the source/drain regions are formed, a compressive-stressed nitride layer may be deposited on the whole semiconductor structure, and then an etching stop layer such as an oxide layer is deposited thereon. Portions of the compressive-stressed layer and the etching stop layer in the nMOSFET region are etched the patterned photoresist as a mask. Then, a tensile-stressed nitride layer is deposited on the whole semiconductor structure, and a portion of the tensile-stressed nitride layer in the pMOSFET region is etched away with the patterned photoresist as a mask. The etching stops on the etching stop layer. As a result, the semiconductor structure shown in FIG. 18 is obtained. In etching the tensile-stressed layer 1016, the photoresist should extend beyond the border of the remained compressive stressed layer after the previous etching, to ensure that in the final semiconductor structure, the tensile-stressed layer 1016 partially overlaps the compressive stressed layer so that the tensile stressed layer and the compressive stressed layer can interact with each other.

Figure 19:
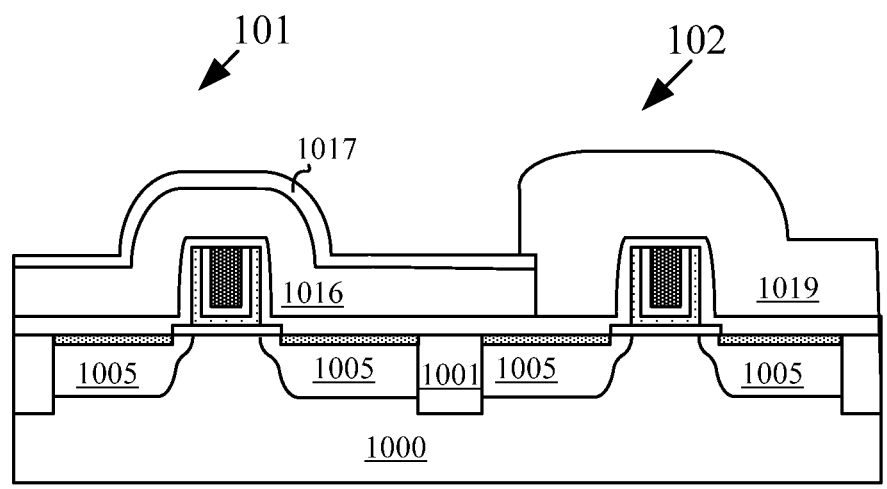

According to a further embodiment of the present invention, as shown in FIG. 19, the tensile stressed layer 1016 and the compressive stressed layer 1019 may be formed so that an interface therebetween is positioned between the second channel region 104 and the nMOSFET region 101. As a result, it is possible to further enhance the interaction force at the interface so that the pMOSFET region is subject to the increased compressive stress and the nMOSFET region is subject to the increased tensile stress, resulting in the further increased tensile stress across the first channel region 103 and the further increased compressive stress across the second channel region 104.

Figure 20:
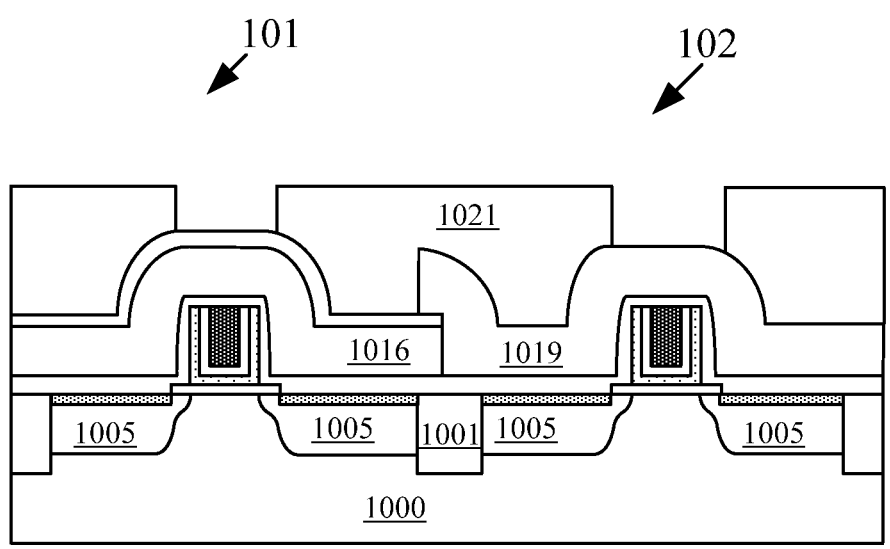

According to an embodiment of the present invention, the process further proceeds from the structure shown in FIG. 17. As shown in FIG. 20, a layer of photoresist is applied on the whole semiconductor structure, and is patterned to remove portions thereof above the respective gate stacks for the nMOSFET and the pMOSFET.

Figure 21:
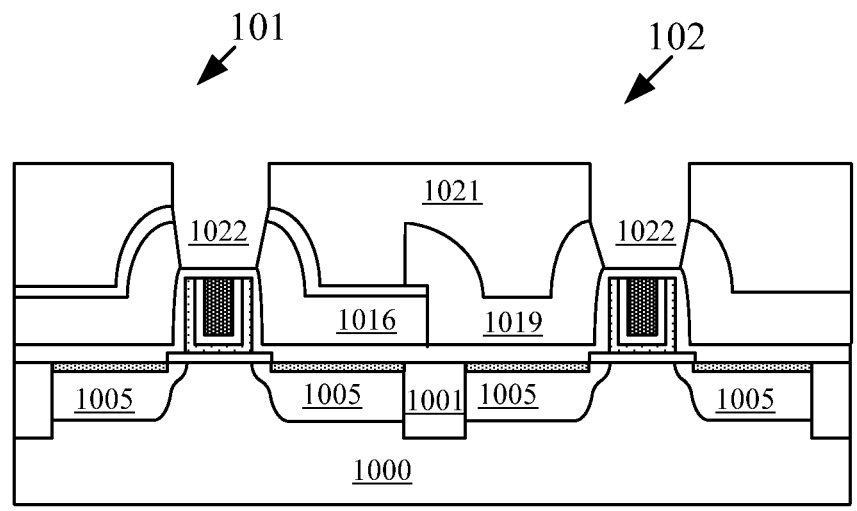

As shown in FIG. 21, the nitride is selectively etched by using the photoresist 1021 as a mask. As a result, the etching stop layer 1017 and the tensile stressed layer 1016 in the nMOSFET region and the compressive stressed layer 1019 in the pMOSFET region are etched away to form openings 1022. The etching stops on the oxide layer 1015.

The photoresist is removed. By means of the further etching, for the nMOSFET, the tensile stress across the first channel region is further enhanced by the reaction force due to the removing of the tensile-stressed nitride cap on top of the gate stack; and for the pMOSFET, the compressive stress across the second channel region is further enhanced by the reaction force due to the removing of the compressive-stressed nitride cap on top of the gate stack. As a result, the channel stress of the semiconductor devices is improved, and thus the carrier mobility is further improved and the performance of the devices is also improved.

Figure 22:
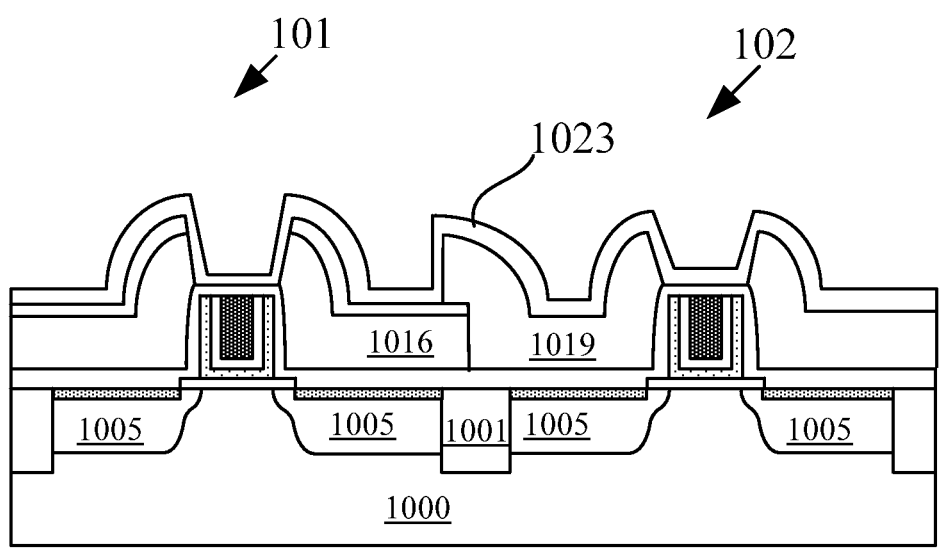
Figure 23:
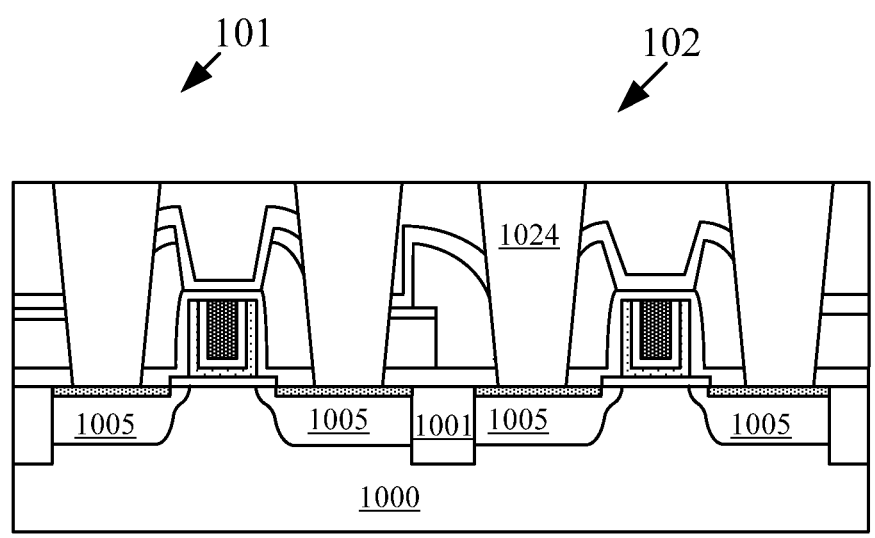

As shown in FIG. 22, a nitride layer 1023 is deposited on the whole semiconductor structure. As shown in FIG. 23, an interlayer dielectric layer is further formed on the whole semiconductor structure, and contacts 1024 in the source/drain regions are formed.

Thus, a semiconductor structure according to a further embodiment of the present invention is achieved, in which, as shown in FIG. 23, for the nMOSFET, the conductive layer within the gate stack has a compressive stress, the source/drain regions have tensile-stressed layers formed thereon, and the gate stack has a opening on top thereof; and for the pMOSFET, the conductive layer within the gate stack has a tensile stress, the source/drain regions have compressive-stressed layers formed thereon, and the gate stack has a opening on top thereof.

In the above description, details of patterning and etching of the respective layers are not provided. It is to be understood by those skilled in the art that various means in the prior art may be utilized to form the layers and regions in desired shapes. Further, to achieve the same feature, those skilled can devise different methods than those described above.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall into the scope of the invention.

What is claimed is:

1. A semiconductor structure, comprising: a semiconductor substrate; a channel region formed on the semiconductor substrate; a gate stack formed on the channel region; and source/drain regions respectively formed on both sides of the channel region and embedded in the semiconductor substrate, wherein the gate stack comprises: a gate dielectric layer formed on the channel region; and a conductive layer positioned on the gate dielectric layer, without a spacer formed on sidewalls of the gate stack;

and wherein for an nMOSFET, the conductive layer has a compressive stress and is configured to release the compressive stress due to lack of the spacer so as to apply a more tensile stress to the channel region; and for a pMOSFET, the conductive layer has a tensile stress and is configured to release the compressive stress due to lack of the spacer so as to apply a more compressive stress to the channel region.

2. The semiconductor structure according to claim 1, wherein the gate dielectric layer extends to form sidewalls of the gate stack.

3. The semiconductor structure according to claim 1, wherein the conductive layer comprises a work function metal layer and a stressed layer, and the stressed layer has a tensile stress or a compressive stress and is positioned on the work function metal layer, and wherein the gate dielectric layer is positioned on the channel region, and the work function metal layer is positioned on the gate dielectric layer and extends to form a portion of sidewalls of the gate stack; or the gate dielectric layer is positioned on the channel region and extends to form sidewalls of the gate stack, and the work function metal layer is positioned on the gate dielectric layer.

4. The semiconductor structure according to claim 1, wherein the conductive layer comprises TiAl.

5. The semiconductor structure according to claim 1, wherein the nMOSFET has a tensile-stressed layer covered thereon, and the pMOSFET has a compressive-stressed layer covered thereon.

6. The semiconductor structure according to claim 5, wherein the tensile-stressed layer covering the nMOSFET or the compressive-stressed layer covering the pMOSFET has an opening formed therein above the gate stack, to enhance the tensile stress across the channel region for the nMOSFET or the compressive stress across the channel region for the pMOSFET.

7. The semiconductor structure according to claim 1, comprising at least one nMOSFET and at least one pMOSFET.

8. The semiconductor structure according to claim 7, wherein an interface between the tensile-stressed layer for the nMOSFET and the compressive-stressed layer for the pMOSFET is farther from the gate stack for the nMOSFET than the gate stack for the pMOSFET.

9. A method for manufacturing a semiconductor structure, comprising:

providing a semiconductor substrate;

forming a sacrificial gate on the semiconductor substrate and a spacer surrounding the sacrificial gate;

forming source/drain regions respectively on both sides of the spacer, so as to form a channel region beneath the sacrificial gate;

removing the sacrificial gate to form an opening within the spacer; and forming a gate stack comprising a conductive layer in the opening, wherein the conductive layer has a stress therein;

removing the spacer to release the stress from the conductive layer to apply an opposite stress to the channel region, wherein, for an nMOSFET, the stress in the conductive layer comprises a compressive stress and the stress applied to the channel region comprises a more tensile stress; and wherein for a pMOSFET, the stress in the conductive layer comprises a tensile stress and the stress applied to the channel region comprises a more compressive stress.

10. The method according to claim 9, wherein the step of forming the gate stack in the opening comprises:

forming a gate dielectric layer in the opening; and forming the conductive layer on the gate dielectric layer.

11. The method according to claim 10, wherein the step of forming the gate dielectric layer in the opening comprises:

forming the gate dielectric layer to cover bottom and sidewalls of the opening so that the gate dielectric layer extends to form sidewalls of the gate stack.

12. The method according to claim 10, wherein the step of forming the conductive layer on the gate dielectric layer comprises:

forming a work function metal layer on the gate dielectric layer; and forming a stressed layer having a tensile stress or a compressive stress on the work function metal layer.

13. The method according to claim 12, wherein, for the nMOSFET, the step of forming the stressed layer comprises sputtering TiAl to form a compressive-stressed layer; and for the pMOSFET, the step of forming the stressed layer comprises alternately forming Ti thin films and Al thin films and annealing to form a tensile-stressed layer made of TiAl.

14. The method according to claim 9, wherein after the conductive layer is formed, the method further comprises: forming a tensile-stressed layer on the nMOSFET, or forming a compressive-stressed layer on the pMOSFET.

15. The method according to claim 14, wherein after forming the tensile-stressed layer or the compressive-stressed layer, the method further comprises: forming an opening in the tensile-stressed layer or the compressive-stressed layer above the gate stack, to enhance the tensile stress across the channel region for the nMOSFET or the compressive stress across the channel region for the pMOSFET.

16. The semiconductor structure according to claim 2, wherein the nMOSFET has a tensile-stressed layer covered thereon, and the pMOSFET has a compressive-stressed layer covered thereon.

17. The semiconductor structure according to claim 3, wherein the nMOSFET has a tensile-stressed layer covered thereon, and the pMOSFET has a compressive-stressed layer covered thereon.

18. The method according to claim 11, wherein the step of forming the conductive layer on the gate dielectric layer comprises:

forming a work function metal layer on the gate dielectric layer; and forming a stressed layer having a tensile stress or a compressive stress on the work function metal layer.

19. The method according to claim 10, wherein after the conductive layer is formed, the method further comprises: forming a tensile-stressed layer on the nMOSFET, or forming a compressive-stressed layer on the pMOSFET.

20. The method according to claim 11, wherein after the conductive layer is formed, the method further comprises: forming a tensile-stressed layer on the nMOSFET, or forming a compressive-stressed layer on the pMOSFET.

* * * * *